(12) United States Patent
Enomoto et al.

(10) Patent No.: US 6,831,235 B1
(45) Date of Patent: Dec. 14, 2004

(54) PRINTED-CIRCUIT BOARD, MULTILAYER PRINTED-CIRCUIT BOARD AND METHOD OF MANUFACTURE THEREOF

(75) Inventors: Ryo Enomoto, Gifu (JP); Masanori Tamaki, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 639 days.

(21) Appl. No.: 10/009,776

(22) PCT Filed: Nov. 16, 2000

(86) PCT No.: PCT/JP00/08103

§ 371 (c)(1),
(2), (4) Date: Dec. 17, 2001

(87) PCT Pub. No.: WO01/60136

PCT Pub. Date: Aug. 16, 2001

(30) Foreign Application Priority Data

Feb. 14, 2000 (JP) ........................................ 2000-035406

(51) Int. Cl.[7] ................................................. H01R 9/09
(52) U.S. Cl. ........................ 174/262; 174/261; 174/263; 29/830; 29/852; 216/18; 361/760
(58) Field of Search ........................... 174/255, 261, 174/262, 263; 257/693; 361/760; 29/846, 852, 830; 216/18, 17; 428/901

(56) References Cited

U.S. PATENT DOCUMENTS

| 5,909,058 | A | * | 6/1999 | Yano et al. ................. 257/793 |
| 5,939,789 | A | | 8/1999 | Kawai et al. |
| 6,207,259 | B1 | * | 3/2001 | Iino et al. ................... 428/901 |
| 6,337,463 | B1 | * | 1/2002 | Gaku et al. ............... 219/121.7 |
| 6,359,235 | B1 | * | 3/2002 | Hayashi ..................... 174/262 |

FOREIGN PATENT DOCUMENTS

| JP | 11-186730 | 7/1999 |
| JP | 2001-144444 | 5/2001 |

* cited by examiner

*Primary Examiner*—Albert W. Paladini
(74) *Attorney, Agent, or Firm*—Oblon, Spivak, McClelland, Maier & Neustadt, P.C.

(57) ABSTRACT

Each via hole of a printed wiring board is filled with a metal conductor. A distal end of each metal conductor is covered with a diffusing metal layer. The distal end of the metal conductor is pressed against a conductor circuit of another substrate, and the printed wiring boards are bonded together by thermocompression bonding. The metal of the distal end of each metal conductor is diffused into the metal of the conductor circuit so that an alloy layer is formed in an interface. As a result, reliability in the interlayer electrical connection can be improved.

10 Claims, 6 Drawing Sheets

(A)

(B)

(C)

(D)

(E)

(F)

(G)

(A)

(B)

(C)

(D)

(E)

PRINTED-CIRCUIT BOARD, MULTILAYER PRINTED-CIRCUIT BOARD AND METHOD OF MANUFACTURE THEREOF

TECHNICAL FIELD

The present invention relates to a multilayer printed wiring board with an interstitial via hole structure.

BACKGROUND ART

A multilayer printed wiring board having an interstitial via hole structure is conventionally fabricated in the following manner. Via holes are formed in a one-side copper-clad laminate so as to extend through an insulating substrate. Each via hole is filled with an electrically conductive paste or a metal conductor by means of copper plating so that the paste or conductor projects from a surface of the insulating substrate. On the other hand, a copper foil is formed by etching into pads on another printed wiring board to be laminated. Both printed wiring boards are bonded together by thermocompression bonding with an adhesive agent such as epoxy being interposed therebetween. As a result, both printed wiring boards are laminated with the adhesive agent therebetween, and a distal end of each metal conductor of the one printed wiring board is brought into contact with the corresponding pad of the other printed wiring board so that the printed wiring boards are electrically connected together.

In the foregoing fabricating method, however, the printed wiring boards are electrically connected together by a mechanical contact between each metal conductor slightly projecting from the printed wiring board and the pad. Accordingly, reliability should be still improved. A method is provided for electroplating the distal end of each metal conductor with a metal with a low melting point, such as Sn/Pb eutectic solder, for improvement in the reliability. However, since a solder melting at a relatively low temperature is used for connection, the reliability is reduced when the printed wiring board undergoes thermal history such as exposure to high temperature. Moreover, since the solder contains lead, the foregoing method is not preferable from the aspect of an environmental issue.

DISCLOSURE OF THE INVENTION

A first invention to solve the foregoing problem is a printed wiring board in which a via hole formed in an insulating substrate is filled with a metal conductor, the printed wiring board being laminated with another printed wiring board, and heated and pressed so that a distal end of the metal conductor is abutted against a conductor circuit formed on a surface of said another printed wiring board so that the printed wiring board is electrically connected to said another printed wiring board, characterized in that at least the distal end of the metal conductor or the surface of the conductor circuit has a metal having a melting point higher than a temperature at which both printed wiring boards are pressed and diffusing into the counter metal during press of the printed wiring boards.

A second invention is characterized in that the conductor circuit formed on the surface of said another printed wiring board or the metal conductor comprise copper and the distal end of the metal conductor is covered with a diffusing metal layer comprising tin.

A third invention is characterized in that the via hole is filled with the metal conductor by an electroplating.

A fourth invention is characterized in that the printed wiring boards described in any one of claims 1 to 3 are bonded together by the thermocompression bonding so that the distal end metal of one printed wiring board is diffused into the conductive circuit metal of the other printed wiring board such that both printed wiring boards are electrically connected to each other.

A fifth invention is a method of fabricating a multilayer printed wiring board, in which a plurality of printed wiring boards are bonded together by thermocompression bonding in a laminated state to be integrated, and a distal end of the metal conductor is pressed against a conductor circuit formed on a surface of said another printed wiring board so that the printed wiring board is electrically connected to said another printed wiring board, characterized by the step of forming a via hole in an insulating substrate of said one printed wiring board, the step of filling the via hole with a metal conductor, the step of forming a diffusing metal layer comprising a metal having a melting point higher than a temperature at which both printed wiring boards are bonded together by the thermocompression bonding and diffusing into the counter metal during the thermocompression bonding of the printed wiring boards, and the step of bonding both printed wiring boards by thermocompression bonding with the metal conductor being pressed against the conductor circuit of the counter printed wiring board.

A sixth invention is characterized in that a surface roughening process is applied to either one or both of the distal end of the metal conductor and the surface of the conductor circuit before the thermocompression bonding of both printed wiring boards.

According to the first invention of the printed wiring board and the fifth invention of the method of fabricating the multilayer printed wiring board, the printed wiring board is laminated with another printed wiring board, and both printed wiring boards are bonded together by the thermocompression bonding while the metal conductor of one board is pressed against the conductor circuit of the other board. In this case, pressure acting upon an interface causes diffusion of the metal even if at least the distal end of the metal conductor or the surface of the conductor circuit comprises a metal having a melting point higher than the temperature of thermocompression bonding. As a result, metal junction having a high strength and good electrical characteristic can be obtained. Accordingly, even when the multilayer printed wiring board undergoes thermal history such as exposure to high temperature, the junction is hard to be loosened and high reliability is obtained in the electrical connection. In this case, the metal diffusion takes place earlier when either one or both of the surfaces of the metal conductor and conductor circuit are roughened. Further, when the surface roughening process is previously applied to the contact surface, a contacting surface area is increased such that the metal diffusion is rendered smoother.

In the second invention, the conductor circuit and the metal conductor are made from copper and accordingly each has a low resistivity. Moreover, tin on the surface of copper of one element diffuses into copper such that a copper-tin alloy layer having a high melting point is formed. Further, according to the printed wiring board of claim 3 in which the via hole is filled with the metal conductor by the electroplating, the density of the metal conductor is increase such that the resistivity is reduced.

In each invention, the insulating substrate is preferably a glass cloth epoxy resin substrate, glass cloth bismaleimide-triazine resin substrate, glass cloth polyphenylene ether resin substrate or aramid unwoven fabric-polyimide resin substrate. The adhesive agent bonding the printed wiring boards in the laminated state is preferably a thermosetting epoxy adhesive. In this case, the temperature preferably ranges between 180° C. and 230° C., and the pressure preferably ranges between 10 and 60 kg/cm². The thermocompression bonding is preferably carried out under reduced pressure.

BEST MODE FOR ENFORCEMENT OF THE INVENTION

Figure 1:
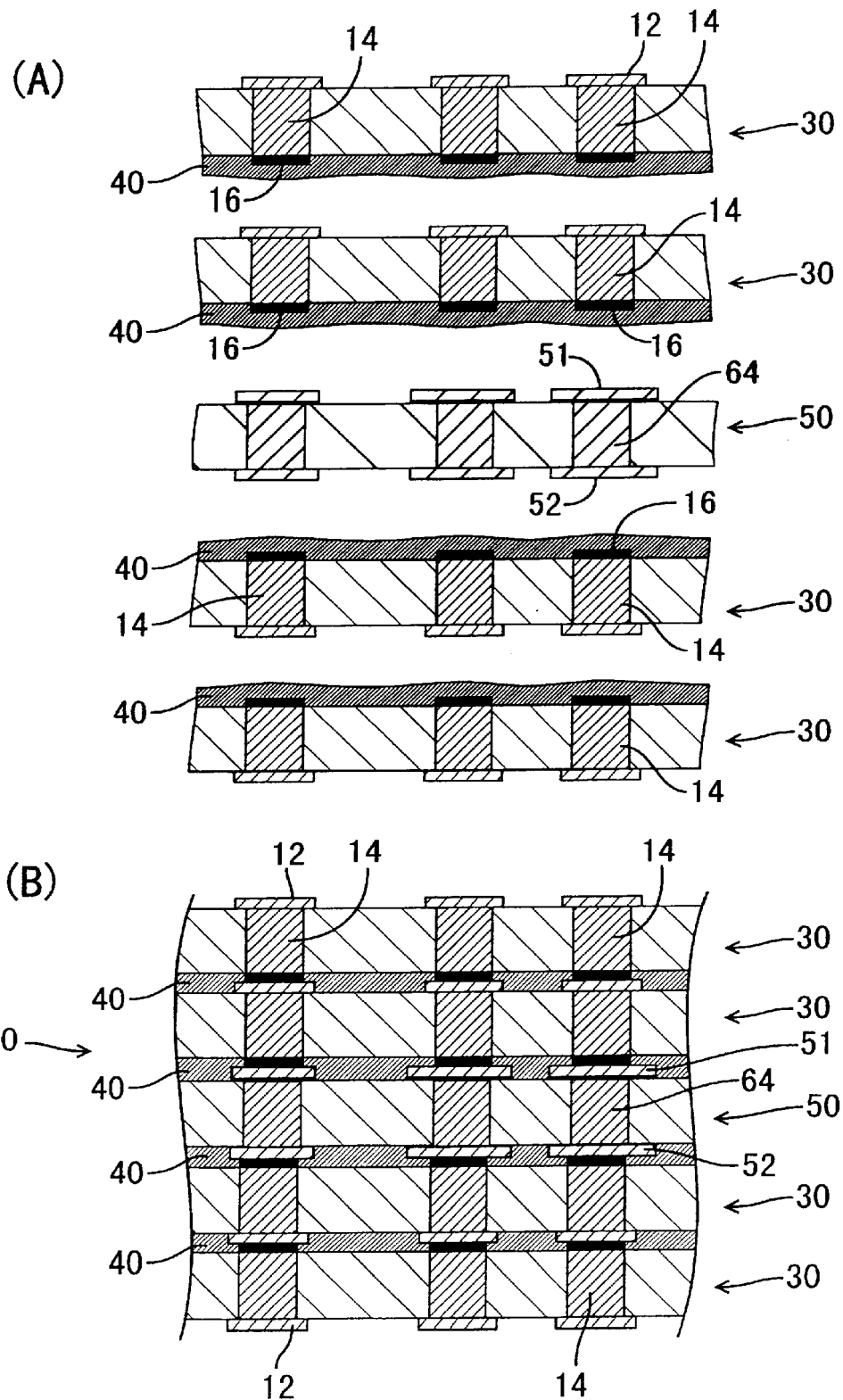
FIG. 1 is a sectional view showing steps of fabricating a multilayer printed wiring board of a first embodiment in accordance with the present invention.
Figure 2:
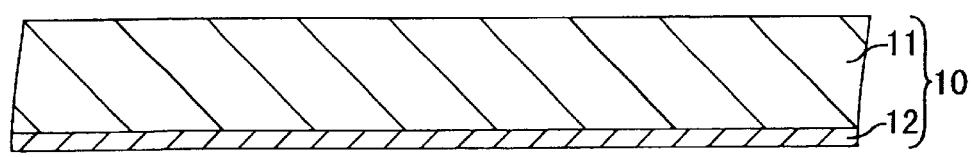
FIG. 2 is a sectional view showing a first half of steps of fabricating a one-side printed wiring board.
Figure 2:
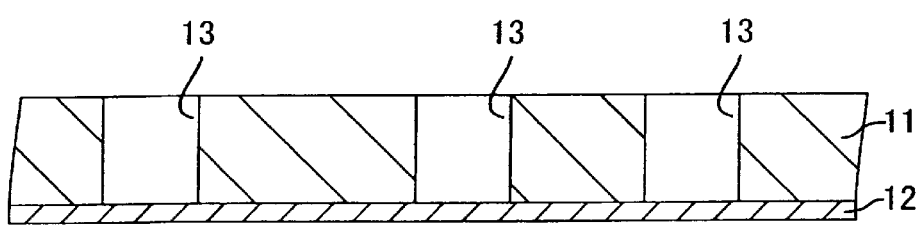
Figure 2:
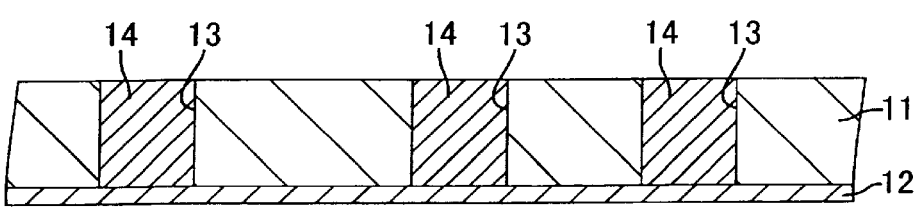
Figure 2:
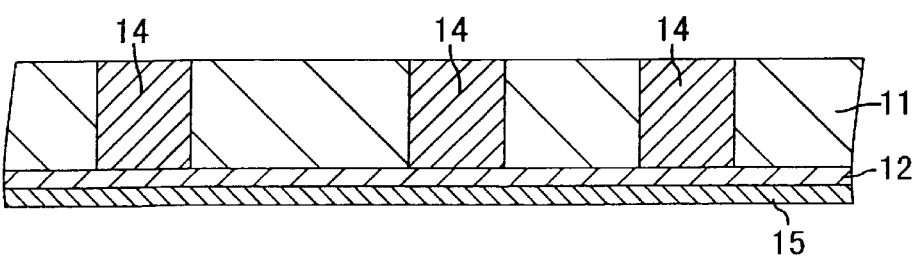

FIG. 1(B) illustrates a multilayer printed wiring board 100 of the embodiment in the completed state. The multilayer printed wiring board 100 is formed by laminating and bonding a plurality of one-side printed wiring boards 30 on both sides of a core substrate 50 as shown in FIG. 1(A). Firstly, fabricating steps for the one-side printed wiring board 30 will be described with reference to FIG. 2. The fabrication starts with a one-side copper-clad laminate 10. The laminate 10 has a well known structure, that is, a copper foil 12 is affixed to one side of an insulating substrate of glass cloth epoxy resin, for example. Laser beams are irradiated onto the insulating substrate 11 at the insulating substrate side so that via holes 13 extending through the insulating substrate 11 are formed so as to assume respective predetermined locations (see FIG. 2(B)).

This laser beam machining is executed by a pulse oscillation $CO_2$ gas laser, for example. Regarding the machining conditions, the pulse energy preferably ranges between 2.0 and 10.0 mJ, the pulse width preferably ranges between 1 and 100 µs, the pulse interval is preferably at or above 0.5 ms, and the number of shots preferably ranges between 3 and 50. A diameter of an opening of each via hole 13 is recommended to range between 50 and 250 µm.

Thereafter, desmearing is carried out in order that resin remaining in the via holes 13 may be removed. The desmearing includes oxygen plasma discharge, corona discharge process, treatment of potassium permanganate, etc. and is desirable for ensuring reliability in connection. Each via hole 13 is filled with a metal conductor 14 or copper by electroplating with the copper foil 12 serving as one electrode (see FIG. 2(C)). An upper face of the metal conductor 14 in each via hole 13 is preferably coplanar with the surface of the insulating substrate 11.

Figure 3:
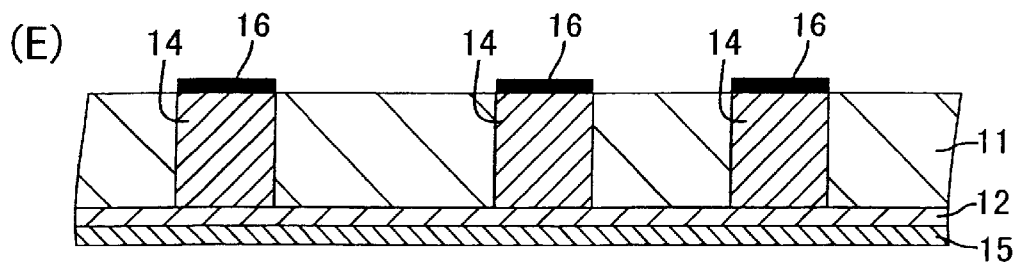
FIG. 3 is a sectional view showing a second half of steps of fabricating the one-side printed wiring board.
Figure 3:
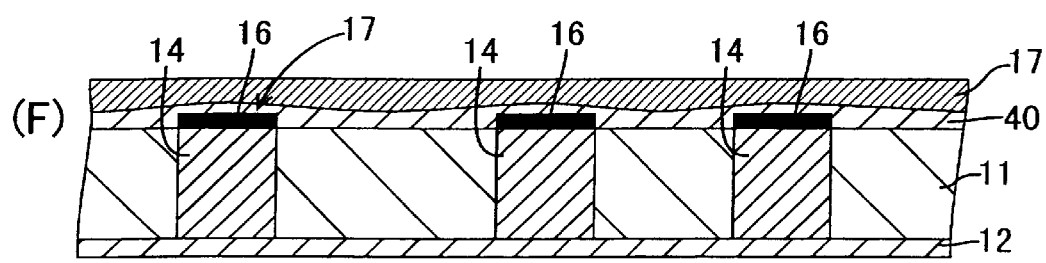
Figure 3:
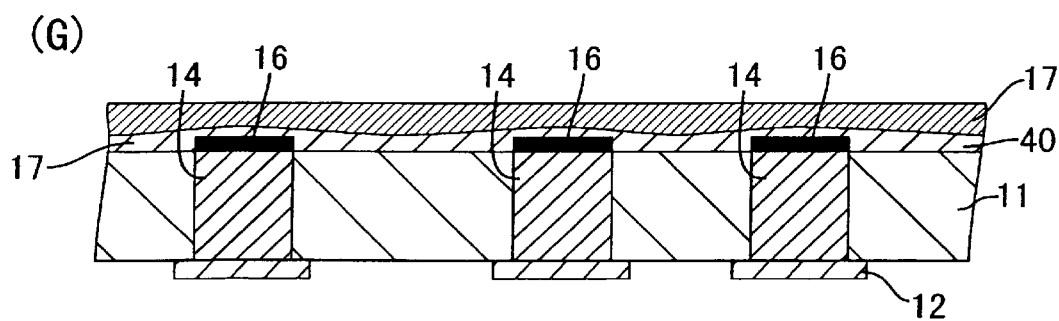

Subsequently, after a protecting sheet 15 is affixed onto the copper foil 12 (see FIG. 2(D)), an acid treatment and a rinsing step are executed. A distal end of each metal conductor 14 is covered with a diffusing metal layer 16 having a thickness ranging between 10 and 20 µm and comprising tin, by tinning (see FIG. 3(E)). An epoxy adhesive 40 is applied to an overall surface of the insulating substrate 11 at the diffusing metal layer 16 side. The adhesive 40 is preliminarily dried so as to be half hardened. A protecting layer 17 is affixed to the adhesive 40 (see FIG. 3(F)). Thereafter, the protecting sheet 15 at the copper foil 12 side is stripped off, and the copper foil 12 is formed into a predetermined pattern by known mask-etching method such that a conductor circuit 8 is formed. Thus, the one-side printed wiring board 30 is completed (see FIG. 3(G)).

Figure 4:
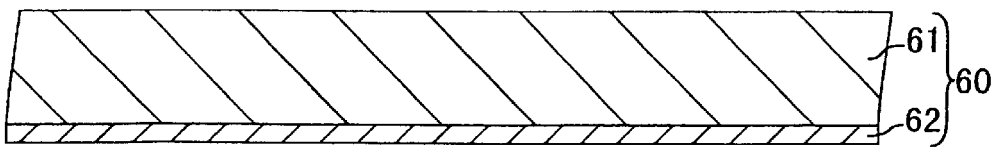
FIG. 4 is a sectional view showing steps of fabricating a core substrate.
Figure 4:
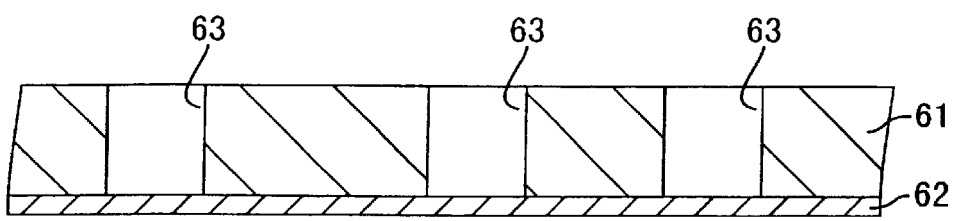
Figure 4:
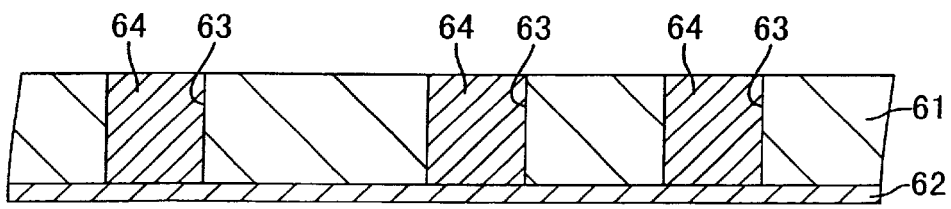
Figure 4:
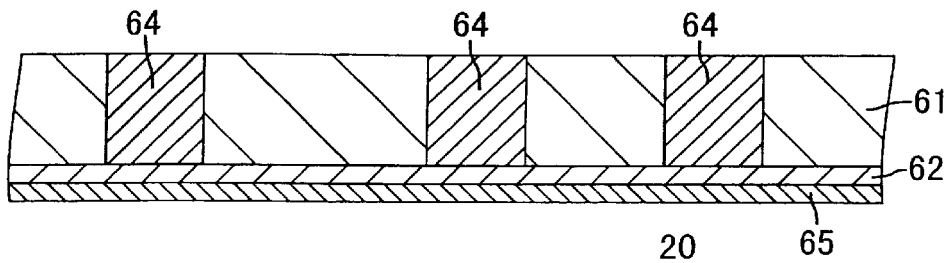
Figure 4:
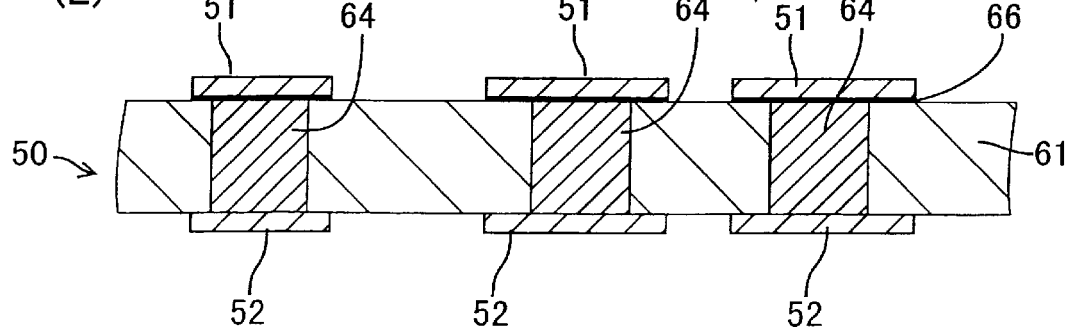

The core substrate is fabricated as shown in FIG. 4. The fabrication starts with a one-side copper-clad laminate 60 having a well known structure, that is, a copper foil 62 is affixed to one side of an insulating substrate 61. Via holes 63 extending through the insulating substrate 11 are formed so as to assume respective predetermined locations (see FIG. 4(B)). Each via hole 63 is filled with a metal conductor 64 or copper by electroplating (see FIG. 4(C)). Thereafter, a protecting sheet 65 is affixed onto the copper foil 62 (see FIG. 4(D)). After a chemical plating layer 66 is formed on the other side of the insulating substrate 61 opposed to the copper foil 62, electroplating (panel plating) is carried out with the chemical plating layer 66 serving as an electrode so that an electroplating layer 67 is formed in piles. A first conductor circuit 51 is formed by the known etching. After the protecting sheet 65 is stripped off, a second conductor circuit 52 is formed on the opposite copper foil 62 by the etching. The substrate is then immersed in an etchant of organic acid for soft etching so that the surface of the pattern is roughened, whereby the core substrate 50 is formed (see FIG. 4(E)).

In order that a multilayer printed wiring board 100 may be fabricated, two one-side printed wiring boards 30 from which the protecting sheets 17 are stripped off are disposed at both sides of the core substrate 50 as shown in FIG. 1(A). These are set in a heating vacuum press to be pressurized in a laminated state while being heated at a predetermined temperature. Distal ends of the metal conductors 14 of each one-side printed wiring board 30 are pressed against the conductor circuits 51 and 52 of the core substrate 50 and conductor circuits 18 of the inner one-side printed wiring boards 30. Consequently, the distal ends of the metal conductors 14 press the conductor circuits 18, 51 and 52, extending through the adhesive 40.

Figure 5:
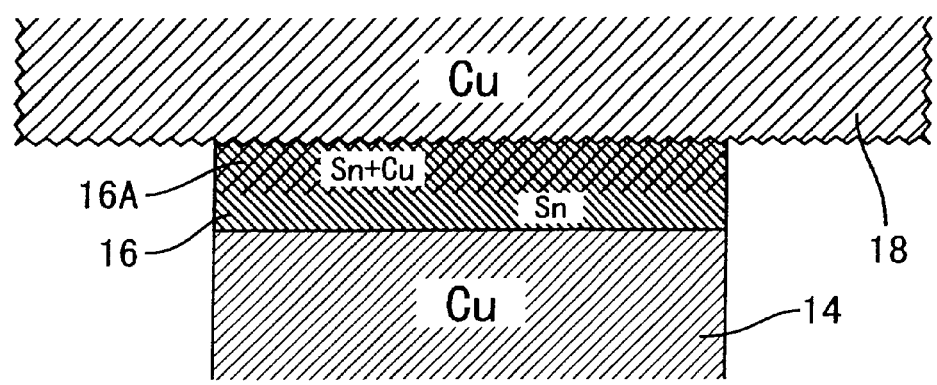
FIG. 5 is a typical sectional view of a junction between a metal conductor and a conductor circuit.

The heating temperature is only a temperature at which the epoxy adhesive 40 hardens even if the heating temperature is at or below the melting point of tin (230° C.). For example, the heating temperature is recommended to range between 180° C. and 230° C. Further, a relative high pressure ranging between 10 kg/cm² and 60 kg/cm² is applied, and the pressurized state is desirably maintained for more than 70 minutes, for example. As a result, the distal ends of the metal conductors 14 formed with the respective diffusing metal layers 16 of tin are pressed against the copper surfaces of the conductor circuits 18, 51 and 52, whereupon the activity in the interface is high. Accordingly, copper atoms gradually diffuse into tin such that an alloy layer is formed in the interface. According to the results of the fluorescent X-ray spectroscopy of the section, as typically shown in FIG. 5, the copper atoms mainly diffuse into tin atoms of the diffusing metal layer 16 so that an alloy layer 16A of copper-tin is formed. Further, by the step of thermocompression bonding, the adhesive 40 completely hardens and the printed wiring boards 30 and 50 are solidified in the laminated state.

According to the multilayer printed wiring board 100 of the embodiment, the pressure acting upon the interface between copper and tin causes diffusion of the metal. As a result, metal junction having a high strength and good electrical characteristic is obtained. Accordingly, even when the multilayer printed wiring board undergoes thermal history such as exposure to high temperature, the junction is hard to be loosened and high reliability is obtained in the electrical connection.

Although tin-plating is applied only to the distal ends of the metal conductors 14 in the foregoing embodiment, thin tin-plated layers having a thickness ranging from 0.5 to 2 $\mu$m may be formed on the counter copper foil (conductor circuits 18, 51 and 52).

<Second Embodiment>

Figure 6:
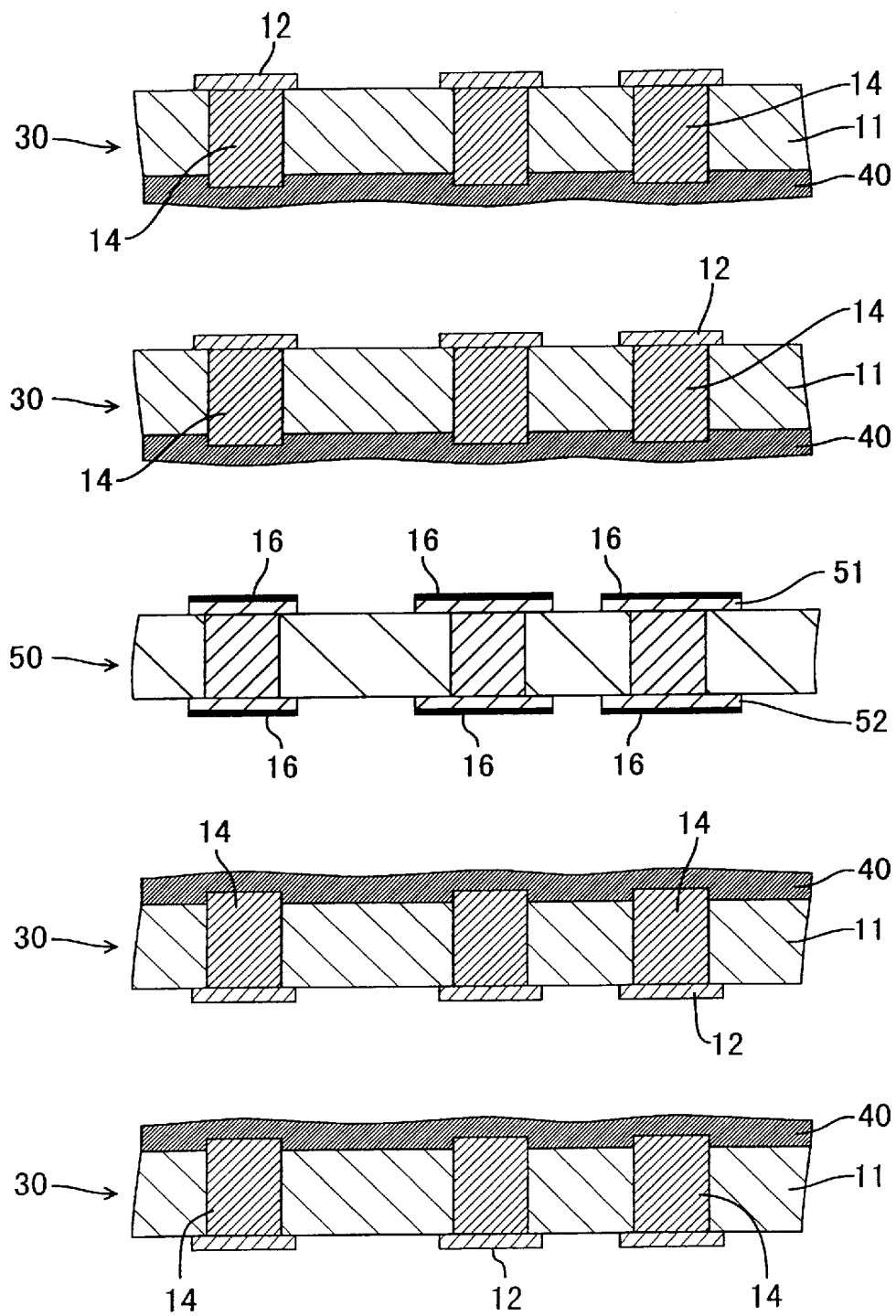
FIG. 6 is a sectional view showing steps of fabricating a multilayer printed wiring board of a second embodiment in accordance with the present invention.

FIG. 6 shows a second embodiment of the invention. The second embodiment differs from the first embodiment in the formation of the diffusing metal layers 16 on the conductor circuits 51 and 52 of the core substrate 50. In this case, the metal conductor 14 filling each via hole 13 of the one-side printed wiring board 30 desirably projects slightly from the surface of the insulating substrate 11. Since the metal junction having a high strength and good electrical characteristic is obtained in this embodiment as in the foregoing embodiment, high reliability is obtained in the electrical connection.

<Other Embodiments>

The present invention should not be limited by the embodiments described above with reference to the drawings. For example, the following embodiments are included in the technical scope of the present invention. Furthermore, the invention may be practiced in various forms without departing from the principle of the invention.

(1) Although the metal conductor filling each via hole is formed by the electroplating in the foregoing embodiments, an electrically conductive paste may be formed into the metal conductor.

(2) Although the first and second conductor circuits are formed by the subtraction method in the foregoing embodiments, the circuits may be formed by an additive method in which an electrically conductive path is formed only in a necessary portion.

Industrial Applicability

The present invention can provide a method of fabricating a printed wiring board and multilayer printed wiring board in which a multilayer printed wiring board having high reliability in the electrical connection between layers.

What is claimed is:

1. A printed wiring board, comprising:

a via hole formed in an insulating substrate filled with a metal conductor, the printed wiring board being laminated with another printed wiring board, and heated and pressed so that a distal end of the metal conductor is abutted against a conductor circuit formed on a surface of said another printed wiring board so that the printed wiring board is electrically connected to said another printed wiring board, wherein at least the distal end of the metal conductor or a surface of the conductor circuit includes a metal having a melting point higher than a temperature at which both printed wiring boards are pressed, and the metal is diffused into the other of the metal conductor or the conductor circuit during pressing of the printed wiring boards.

2. A printed wiring board according to claim 1, wherein the conductor circuit formed on the surface of said another printed wiring board or the metal conductor comprises copper and the distal end of the metal conductor is covered with a diffusing metal layer comprising tin.

3. A printed wiring board according to claim 2, wherein the via hole is filled with the metal conductor by electroplating.

4. A multilayer printed wiring board wherein the printed wiring boards according to claim 3 are bonded together by the thermocompression bonding so that a distal end metal of one printed wiring board is diffused into the conductive circuit metal of the other printed wiring board such that both printed wiring boards are electrically connected to each other.

5. A multilayer printed wiring board wherein the printed wiring boards according to claim 2 are bonded together by the thermocompression bonding so that a distal end metal of one printed wiring board is diffused into the conductive circuit metal of the other printed wiring board such that both printed wiring boards are electrically connected to each other.

6. A printed wiring board according to claim 1, wherein the via hole is filled with the metal conductor by an electroplating.

7. A multilayer printed wiring board wherein the printed wiring boards according to claim 6 are bonded together by the thermocompression bonding so that a distal end metal of one printed wiring board is diffused into the conductive circuit metal of the other printed wiring board such that both printed wiring boards are electrically connected to each other.

8. A multilayer printed wiring board wherein the printed wiring boards according to claim 1 are bonded together by thermocompression bonding so that a distal end metal of one printed wiring board is diffused into the conductive circuit metal of the other printed wiring board such that both printed wiring boards are electrically connected to each other.

9. A method of fabricating a multilayer printed wiring board, in which a plurality of printed wiring boards are bonded together by thermocompression bonding in a laminated state to be integrated, and a distal end of a metal conductor is pressed against a conductor circuit formed on a surface of an another printed wiring board so that the printed wiring board is electrically connected to said another printed wiring board, the method comprising:

forming a via hole in an insulating substrate of said one printed wiring board;

filling the via hole with a metal conductor;

forming a diffusing metal layer comprising a metal having a melting point higher than a temperature at which both printed wiring boards are bonded together by the thermocompression bonding onto an end of the metal conductor or a surface of the conductor circuit;

diffusing the metal layer into the other of the metal conductor or the conductor circuits during the thermocompression bonding of the printed wiring boards; and bonding both printed wiring boards by thermocompression bonding with the metal conductor being pressed against the conductor circuit of the another printed wiring board.

10. A method of fabricating a multilayer printed wiring board according to claim 9, wherein applying a surface roughening process to either one or both of the distal end of the metal conductor and the surface of the conductor circuit before the thermocompression bonding of both printed wiring boards.

* * * * *